United States Patent [19]
Todokoro et al.

[11] Patent Number: 5,424,541
[45] Date of Patent: Jun. 13, 1995

[54] SCANNING ELECTRON MICROSCOPE AND METHOD FOR CONTROLLING A SCANNING ELECTRON MICROSCOPE

[75] Inventors: Hideo Todokoro, Tokyo; Tadashi Ohtaka, Katsuta, both of Japan

[73] Assignee: Hitachi, Ltd., Tokyo, Japan

[21] Appl. No.: 312,181

[22] Filed: Sep. 26, 1994

Related U.S. Application Data

[63] Continuation of Ser. No. 34,373, Mar. 18, 1993, abandoned.

[30] Foreign Application Priority Data

Mar. 19, 1992 [JP] Japan ................................. 4-092441

[51] Int. Cl.⁶ .............................................. H01J 37/09
[52] U.S. Cl. ...................................... 250/310; 250/307
[58] Field of Search ........................ 250/310, 307, 397

[56] References Cited

U.S. PATENT DOCUMENTS

| | | | |
|---|---|---|---|
| 3,787,696 | 1/1974 | Dao et al. | 250/310 |
| 4,177,379 | 12/1979 | Furukawa et al. | 250/310 |
| 4,516,026 | 5/1985 | Jouffrey et al. | 250/310 |
| 4,658,137 | 4/1987 | Garth et al. | 250/310 |
| 4,728,790 | 3/1988 | Plies | 250/310 |
| 4,766,372 | 8/1988 | Rao | 250/310 |
| 4,982,091 | 1/1991 | Garth et al. | 250/310 |
| 5,146,090 | 9/1992 | Plies | 250/310 |

*Primary Examiner*—Bruce C. Anderson
*Attorney, Agent, or Firm*—Evenson, McKeown, Edwards & Lenahan

[57] ABSTRACT

A scanning electron microscope is provided with a channel cylinder between a sample and an electron source. The channel cylinder generates a deceleration electrical field to decelerate an electron beam emitted from the electron source. The channel cylinder has a portion having an electron source side and sample side. A detector is provided on the electron source side and sample channel cylinder portion. The detector detects the secondary signal emitted from the sample, so that a scan image is obtained with a high spatial resolution.

22 Claims, 9 Drawing Sheets

SCANNING ELECTRON MICROSCOPE AND METHOD FOR CONTROLLING A SCANNING ELECTRON MICROSCOPE

This application is a continuation of application Ser. No. 08/034,373, filed on Mar. 18, 1993.

BACKGROUND AND SUMMARY OF THE INVENTION

The present invention relates to a scanning electron microscope for obtaining a scan image by scanning an electron spot on a sample, particularly to a scanning electron microscope capable of obtaining a scan image with a high spatial resolution.

A scanning electron microscope has been conventionally used for observation and length measurement of submicron-order (1 micron or less), such as contact holes and line patterns in a semiconductor device sample. The scanning electron microscope obtains a scan image (SEM image) by scanning an electron beam emitted from an electron source on a sample to detect a secondarily-obtained signal (secondary electrons and reflected electrons) and using the secondary signal for the brightness modulation input for a cathode ray tube scanned synchronously with the electron beam scanning.

A semiconductor device sample is generally made by forming an electrical insulation such as SiO2 or SiN on a conductive portion of Al or Si. When an electron beam is applied to the semiconductor device sample, the surface of the electrical insulation is negatively electrified (hereafter expressed simply as "charge-up") and secondary electrons generated at the bottom of a contact hole are prevented from rising by negatively-electrified electric charges on the sample surface. Therefore, the secondary electrons cannot be detected by a detector. As a result, abnormal contrast or extreme distortion may occur in the SEM image.

The above image defects due to charge-up seriously affects the observation of contact holes and length measurement of lines-and-spaces. Therefore, this makes it difficult to not only evaluate semiconductor manufacturing processes but assure the quality of semiconductor devices. For this reason, a so-called low acceleration SEM has been conventionally used in which the energy of the primary electron beam applied to a sample is 10 keV or lower.

Because scanning electron microscopes have been used for semiconductor manufacturing processes and finished-product inspection processes (e.g. inspection of electric operations by an electron beam) in recent years, a high resolution of 10 nm or less at a low acceleration voltage of 1,000 V or lower has been required in order that an insulation can be observed without electrification.

However, if the acceleration voltage lowers, observation at a high magnification gets difficult because the resolution is extremely degraded due to chromatic aberration caused by variation of electron beam energy. If electron current decreases, the ratio of secondary signal to noise (S/N) extremely decreases, the contrast of an SEM image is impaired, and observation at high magnification and resolution becomes difficult. Especially for a semiconductor device made by an ultrafine processing technique, signals generated from recessed portions of contact holes and line patterns become weak. Therefore, this makes minute observation and length measurement very difficult.

To solve the problem, one approach (see description in "Some Approaches to Low-Voltage Scanning Electron Microscopy" by Müllerova, et al., Ultramicroscopy 41, 1992, page 399–410) provides a scanning electrical microscope capable of increasing the energy of the electron beam applied to the sample, caused by generating a decelerating electrical field, by applying a negative voltage to the sample, so as to keep the acceleration voltage comparatively high.

However, in the above art, because negative voltage is applied to the sample, the secondary electrons emitted from the sample are prevented from rising. Therefore, the problem of so called charge-up occurs.

To solve the problem, for example, Japanese Patent Laid-Open No. 22339/1991 discloses a scanning electron microscope capable of decreasing chromatic aberration by applying positive voltage to a channel cylinder of an electrooptical system to give high energy to an electron beam passing through a lens and by generating a deceleration electric field between the channel cylinder and a sample to decelerate the electron beam to be applied to the sample.

In the art, because the deceleration electric field is provided between the channel cylinder and the sample liner tube, the sample is capable of being prevented from applying the negative voltage.

However, the above prior art cannot be used because the publication does not describe any concrete secondary signal detection method. That is, the above art requires the application of a very high acceleration voltage (approx. 9,000 V) to secure a sufficient electron current because it uses a thermal-emission-type electron gun as an electron source. Therefore, the primary electron beam has a high energy (e.g. 10 keV). Thus, the ratio of energies of the primary electron beam before and after deceleration by a deceleration electric field is decreased and resultingly, the ratio of the energy of the primary electron beam to that of the secondary signal is decreased. Thereby, it is difficult to selectively acquire secondary signals.

An object of the present invention is to provide a scanning electron microscope capable of detecting a secondary signal emitted from a sample to obtain a scan image with a high spatial resolution.

This and other objects of the present invention are achieved by providing a scanning electron microscope for scanning an electron beam on a sample, and obtaining an image on the basis of a secondary signal produced from said sample, comprising an electron source for emitting the electron beam and a channel cylinder to which is applied positive voltage. The channel cylinder has a portion proximate to the sample, the channel cylinder portion having an electron source side and a sample side. The channel cylinder is between the electron source and the sample and a detector for detecting the secondary signal, and the detector is located on the electron source side of the channel cylinder, wherein the sample is grounded.

With the above embodiment of the present invention, chromatic aberration is decreased because the primary electron beam passing through a lens is given a high energy due to the acceleration voltage generated by the channel cylinder, and the primary electronbeam applied to the sample is decelerated by the deceleration electric field that is generated. Therefore, charge-up of the sample surface is prevented.

The secondary signal produced from the sample is accelerated in the upward direction between the sample and the channel cylinder, because the direction of the beam emitted from the electron source is opposite from the direction of the secondary signal produced from the sample. The secondary signal is forced to rise upward by the deceleration field, so as to move upward to the detector which is located on the electron side of the channel cylinder. Therefore, the detector can easily detect the secondary signal which is moved close to the detector due to the deceleration field.

To achieve the above objects, certain embodiments of the present invention comprise a channel cylinder which is provided to cover an electron channel extending from a field-emission-type electron gun to an objective and which forms an acceleration electric field in the channel cylinder, a deceleration electric field forming means for forming a deceleration electric field for a primary electron beam between the objective and a sample, and a secondary signal detecting means for detecting secondary signals attracted into the channel cylinder on the electron source side of the objective.

Because the field-emission-type electron gun is used as the electron source, the energy of the primary electron beam is decreased and the ratio of the energy of the primary electron beam before the deceleration by the deceleration electric field to that after the deceleration is increased. Therefore, the ratio of the energy of the primary electron beam to that of the secondary signal is increased and secondary signals can easily be acquired selectively.

Other objects, advantages and novel features of the present invention will become apparent from the following detailed description of the invention when considered in conjunction with the accompanying drawings.

DETAILED DESCRIPTION OF THE DRAWINGS

Figure 1:
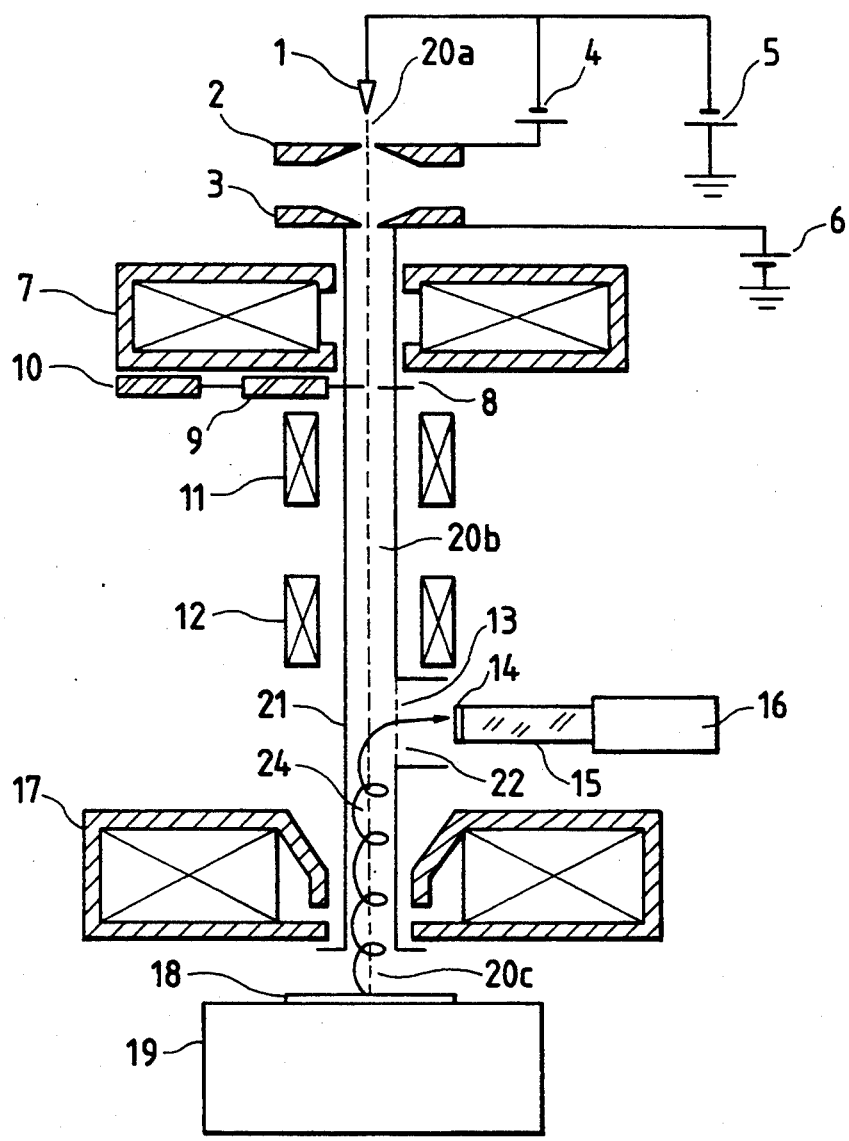
FIG. 1 is a block diagram of the scanning electron microscope which is the first embodiment of the present invention.

FIG. 1 is a schematic block diagram of a scanning electron microscope which is an embodiment of the present invention. In FIG. 1, a cathode 1, draw-out electrode 2, and anode 3 constitutes a field-emission-type electron gun. A draw-out voltage 4 is applied between the cathode 1 and draw-out electrode 2, and an acceleration voltage 5 (e.g. 500 V) is applied to the cathode 1. An electron beam 20a emitted from the cathode 1 is further accelerated by the voltage applied between the draw-out electrode 2 and anode 3.

In conventional constructions, the electron beam energy (acceleration voltage) passing through the anode 3 coincides with the acceleration voltage 5 because the anode 3 is at ground potential. In this embodiment of the invention, however, the acceleration voltage of the electron beam passing through a channel cylinder 21 becomes equal to the sum (1,000 V) of the acceleration voltage 5 (500 V) and a superimposed voltage 6 (e.g. 500 V) because the superimposed voltage 6 (500 V) is applied to the anode 3 and channel cylinder 21.

The electron beam 20b accelerated as the result of passing through the anode 3 is focused onto a sample 18 by a condenser lens 7 and an objective 17. The electron beam passing through the objective 17 is decelerated while it travels from the channel cylinder 21 to the sample 18 and obtains an energy equivalent to the acceleration voltage 5.

The divergence angle of the electron beam at the objective 17 is determined by an aperture 8 set under the condenser lens 7. The aperture 8 is electrically connected with the channel cylinder 21 and kept at the same potential as the channel cylinder 21. Centering of the aperture 8 is performed by operating an adjusting knob 10 through an insulating rod 9.

The accelerated electron beam 20b is deflected by an upper scanning coil 11 and a lower scanning coil 12. On the sample 18, a decelerated focused electron beam 20c is scanned in a raster-like fashion. The sample 18 is mounted on a sample stage 19 whose position can be adjusted, for example, in a horizontal direction. In this embodiment, the scanning coil has two stages so that the scanned electron beam always passes through the center of the objective 17.

Secondary electrons 24 emitted from the sample 18 because the decelerated electron beam 20c is applied to the sample are attracted into the channel cylinder 21 by the positive superimposed potential 6 applied to the channel cylinder 21 and spirally moved up in the channel cylinder 21 by the magnetic field of the objective 17.

An opening 22 is formed in the side of the channel cylinder 21 on the electron source side of the objective 17. An attracting electrode 13 to which a voltage higher than that of the channel cylinder 21 is applied, for example, a voltage obtained by adding 300 V to the superimposed voltage 6, is disposed at the opening 22. The secondary electrons 24 moved up in the channel cylinder 21 are attracted by the attracting electrode 13 and further attracted and accelerated by a scintillator 14 to which the positive potential of 10 kV is applied to make the scintillator emit light.

The emitted light is directed to a light amplifier 16 by a light guide 15 and converted into electric signals. The output of the light amplifier 16 is further amplified to serve as the brightness modulation input of a cathode ray tube. However, the diagram showing the process is not illustrated.

In this embodiment, chromatic aberration is improved and charge-up of a sample is eliminated because the energy of the electron beam 20b passing through the condenser lens 7, aperture 8, and objective 17 is larger than the energy of the electron beam 20c at the final stage.

Concretely, as the result of an experiment performed by the inventor, chromatic aberration is decreased to approximately 70% and the beam diameter which is 15 nm only in the application of the acceleration voltage (500 V) is improved to 10 nm by applying a voltage equal to the sum of the acceleration voltage (500 V) and the superimposed voltage 6 (500 V).

Moreover, because this embodiment uses a field emission-type electron gun as an electron source, the energy of the primary electron beam decreases and the energy ratio of the accelerated primary electron beam 20c to the decelerated primary electron beam 20b comparatively increases. Therefore, the energy ratio of the accelerated primary electron beam 20b to the secondary electrons 24 increases and secondary electrons can easily be captured selectively by the attracting electrode 13.

Figure 2:
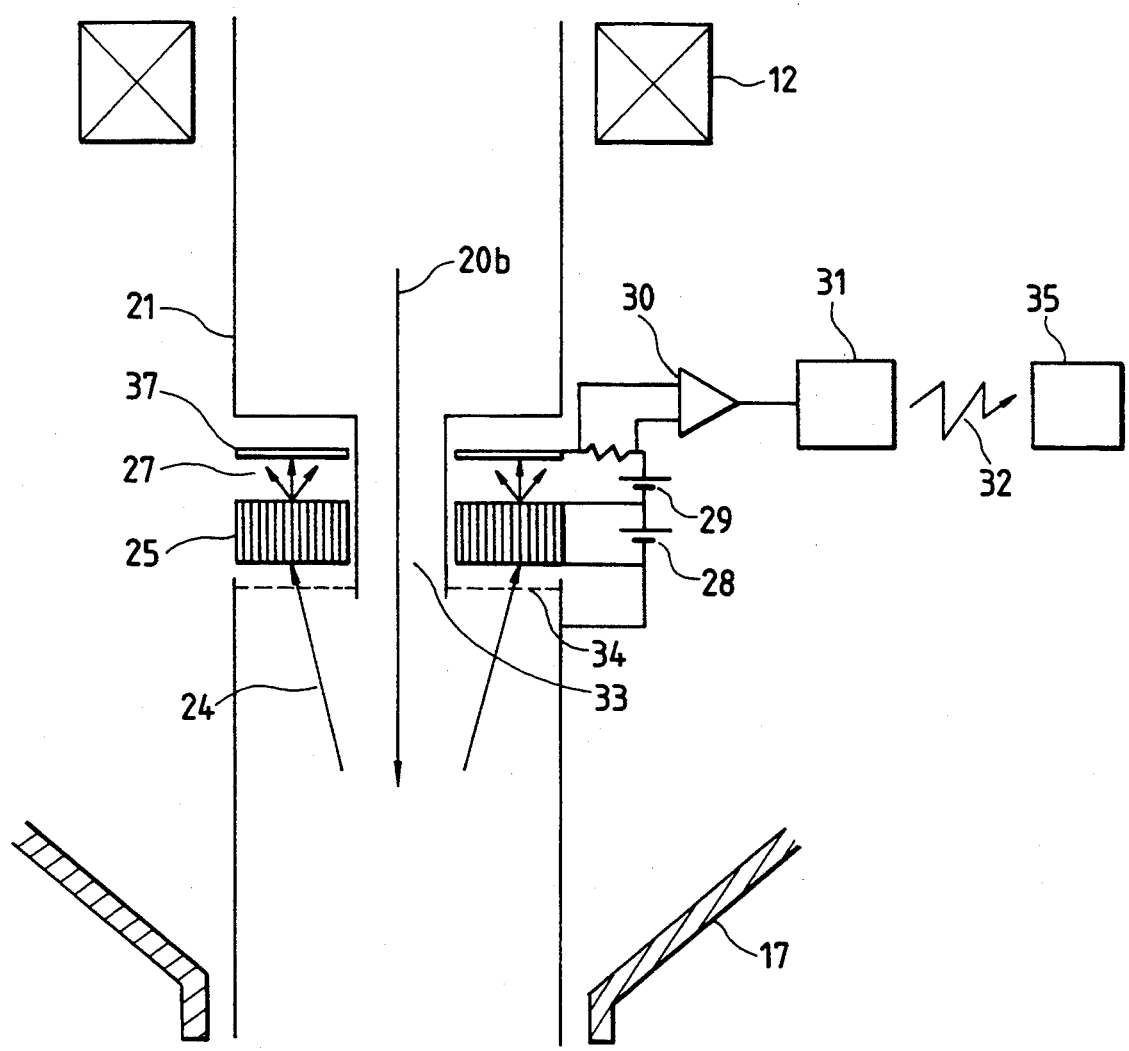
FIG. 2 is a block diagram of the scanning electron microscope which is the second embodiment of the present invention.

FIG. 2 is a block diagram of the essential portion of a scanning electron microscope which is a second embodiment of the present invention, in which the same symbols as those of the first embodiment represent the same or equivalent portions.

The above first embodiment detects the secondary electrons 24 by directing them to the outside of the channel cylinder 21 by the attracting electrode 13. However, the second embodiment is characterized in that the secondary electrons are detected by a plate detector 25.

In FIG. 2, the discoid channel plate detector 25 having a central hole 33 and the same potential as of the channel cylinder 21 is disposed between the objective 17 and the lower scanning coil 12. Moreover, a mesh 34 is provided under the channel plate detector 25.

In the above construction, the accelerated electron beam 20b passes through the central hole 33 of a microchannel plate 25 before it is focused by the objective 17 and applied onto the sample 18. The diameter of the central hole 33 is set to a value such that the electron beam 20b deflected by the scanning coil 12 can pass through the hole without colliding with the microchannel plate 25.

The secondary electrons 24 emitted from the sample 18 undergo the lens-action of the objective 20 17, pass through the mesh 34 set on the entire surface while diverging, and enter the channel plate 25. The secondary electrons 24 having entered the channel plate 25 are accelerated and amplified by an amplifying voltage 28 applied to both ends of the channel plate 25. The amplified electrons 27 are further accelerated by the anode voltage 29 and captured by the anode 37.

The captured secondary electrons are amplified by an amplifier 30 before they are converted into the light by the light converting circuit 31 because the amplifier 30 is brought in a floating state due to the amplifying voltage 28 of the channel plate 25, and so forth.

The light 32 is converted into electric signals again by the electricity converting circuit 35 at ground potential and used as the brightness modulation signal for the scan image. Therefore, the second embodiment also has one of the same advantages as that of the first embodiment.

Figure 3:
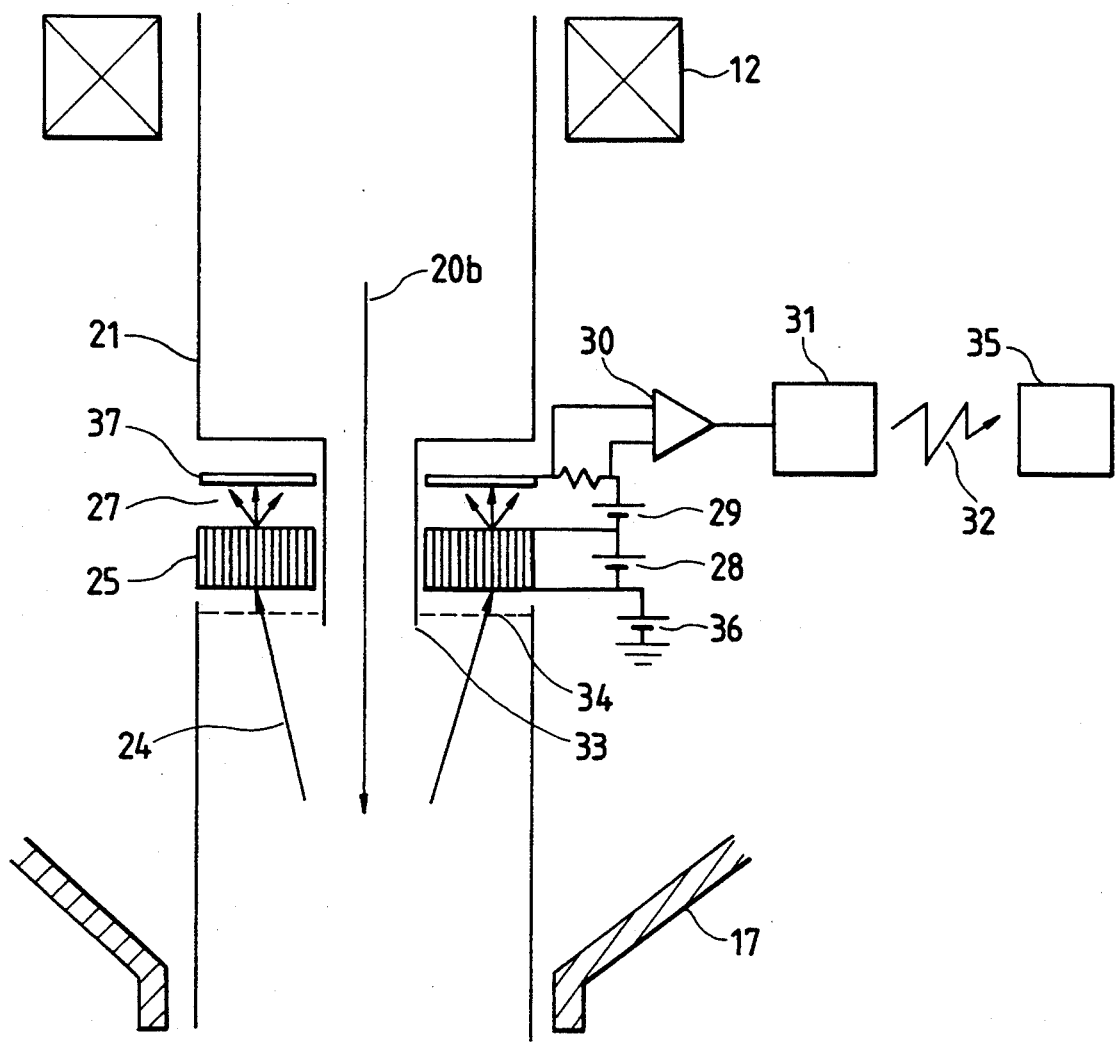
FIG. 3 is a block diagram of the scanning electron microscope which is the third embodiment of the present invention.

FIG. 3 is a block diagram of the essential portion of a scanning electron microscope which is a third embodiment of the present invention. The same symbols as those of the second embodiment represent the same or equivalent portions. The third embodiment is characterized in that desired secondary signals can selectively be detected.

In FIG. 3, a filter voltage 36 capable of optionally controlling the potential of the channel plate 25 is applied to the channel plate 25. For example, when the filter voltage 36 is assumed to be a negative voltage of approximately 10 V, some electrons among secondary electrons emitted from a sample and reflected electrons are repelled by an inverse electric field produced between the channel plate 25 and mesh 33 and only reflected electrons having large energies can selectively be detected.

It is also possible to find the potential of the sample by measuring the filter voltage 36 which is a limit for repelling secondary electrons. Thus, it is possible to inspect the functions of finished semiconductor devices by adding such a function.

Figure 4:
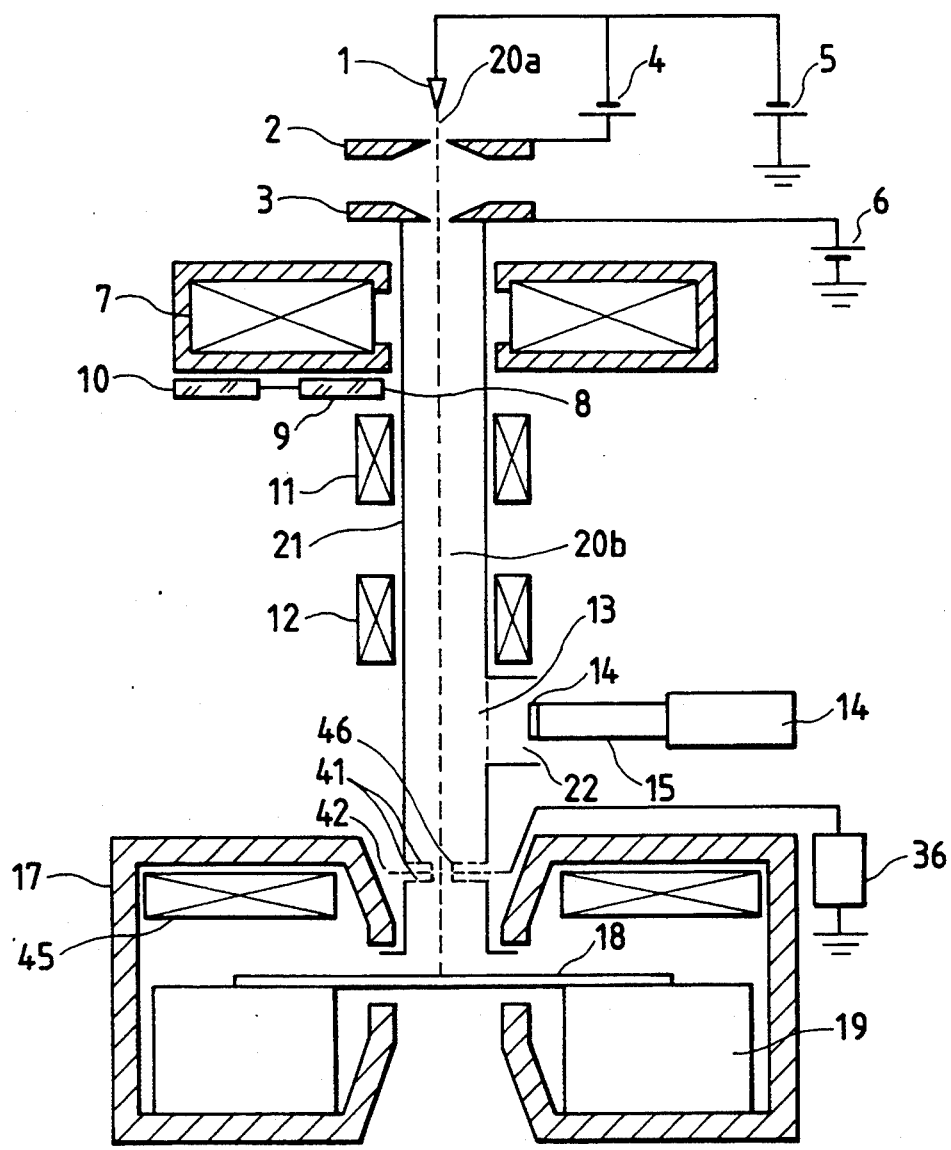
FIG. 4 is a block diagram of the scanning electron microscope which is the fourth embodiment of the present invention.

FIG. 4 is a block diagram of a scanning electron microscope which is a fourth embodiment of the present invention. The same tools as those of the third embodiment represent the same or equivalent portions. This embodiment is characterized in that the channel cylinder 21 is provided with an energy filter (potential barrier). This embodiment especially shows an example suitable for the in-lens system in which a sample 18 is placed in the objective 17.

The energy filter comprises a cylinder 46, shield grid 41, and energy filter 42. Similarly to the third embodiment in FIG. 3, this embodiment makes it possible to measure the potential of the sample 18 by controlling a filter voltage 36 and properly adjusting the potential of the energy filter 42.

Moreover, this embodiment makes it possible to selectively detect only secondary electrons without detecting reflected electrons by properly selecting the voltage of the attracting electrode 13. In this case, reflected electrons are not detected but they are moved up in the channel cylinder 21, strike it and are cylinder absorbed in it.

In this in-lens system, a sample stage 19 is disposed inside the objective 17. The exciting coil 25 45 of the objective 17 is secured at an upper part of the objective 17. The objective 17 is large enough to house 8-in wafers.

Figure 5:
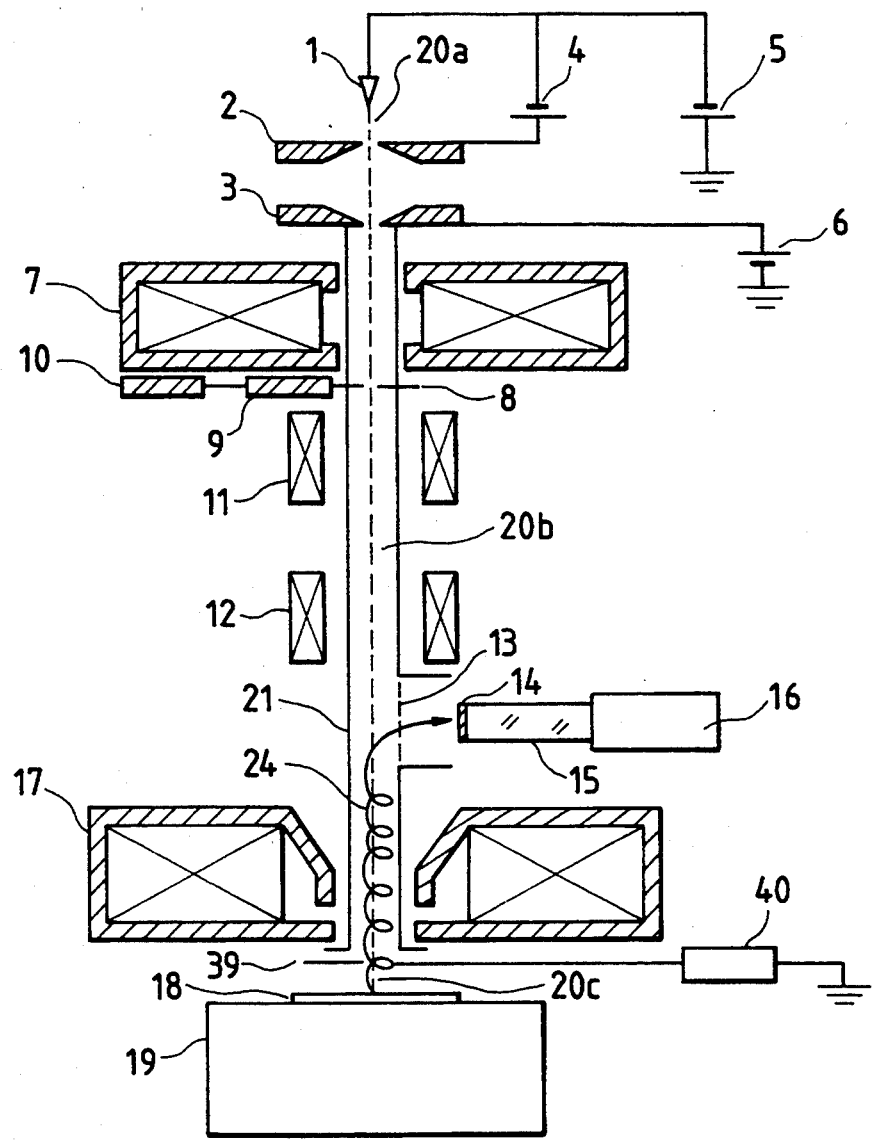
FIG. 5 is a block diagram of the scanning electron microscope which is the fifth embodiment of 5 the present invention.

FIG. 5 is a block diagram of a scanning electron microscope which is a fifth embodiment of the present invention. The same symbols as those of the fourth embodiment represent the same or equivalent portions. This embodiment is characterized in that a sample is protected which may be damaged if a strong electric field is applied to it.

Semiconductor integrated circuits may be broken down by an electric field produced by the superimposed voltage 6 applied to the channel cylinder 21. To solve the problem, this embodiment is provided with the control electrode 39 between the objective 17 and the sample 18 to apply the control voltage 40 to the control electrode 39.

For example, when the superimposed voltage 6 is 500 V, the electric field produced by the superimposed voltage 6 is moderated by applying the control voltage 40 of several tens of voltages and the device can be prevented from breaking down.

Figure 6:
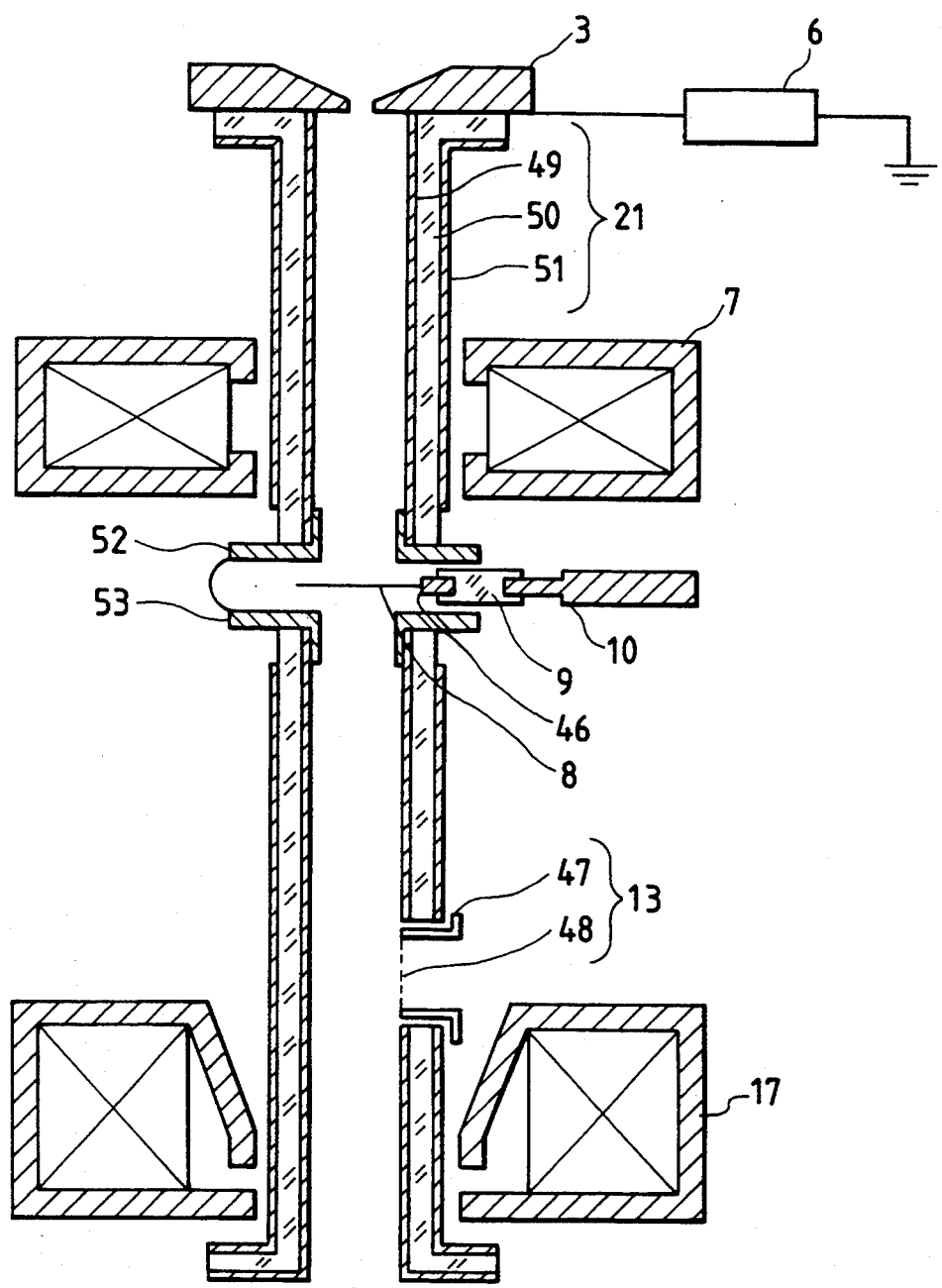
FIG. 6 is a block diagram of the scanning electron microscope which is the sixth embodiment of the present invention.

FIG. 6 is a block diagram of the essential portion of a scanning electron microscope which is a sixth embodiment of the present invention. The same symbols as those of the fifth embodiment represent the same or equivalent portions.

This embodiment is characterized in that the channel cylinder 21 is made by covering the inner and outer surfaces of a ceramic cylinder 50 with conductive films 49 and 51 respectively which are insulated from each other.

The conductive film 49 of the ceramic cylinder 50 is electrically connected with the anode 3, to which the superimposed voltage 6 is applied. The outer conductive film 51 is insulated from the inner conductive film 49 by the wall of the ceramic cylinder and kept at ground potential.

The ceramic cylinder 50 is cut and divided at the introductory portion of the aperture 8 and the cut ends thereof are connected with an upper disk 52 and a lower disk 53 respectively. The aperture 8 is connected with the ground-potential adjusting knob through the insulating rod 9. When the aperture 8 is set between the upper disk 52 and the lower disk 53, it is electrically connected with the lower disk 53 by a conductive spring 46. A circular window opens in the side wall of the ceramic cylinder 50 above the objective 17, and an attracting grid 48 secured by the ring is disposed. In this case, the description of the method of attracting and detecting secondary electrons is omitted because the method is the same as that described with respect to FIG. 1.

This embodiment makes it easy to mount various devices on the channel cylinder 21 because the inner and outer surfaces of the channel cylinder 21 are insulated from each other.

Figure 7:
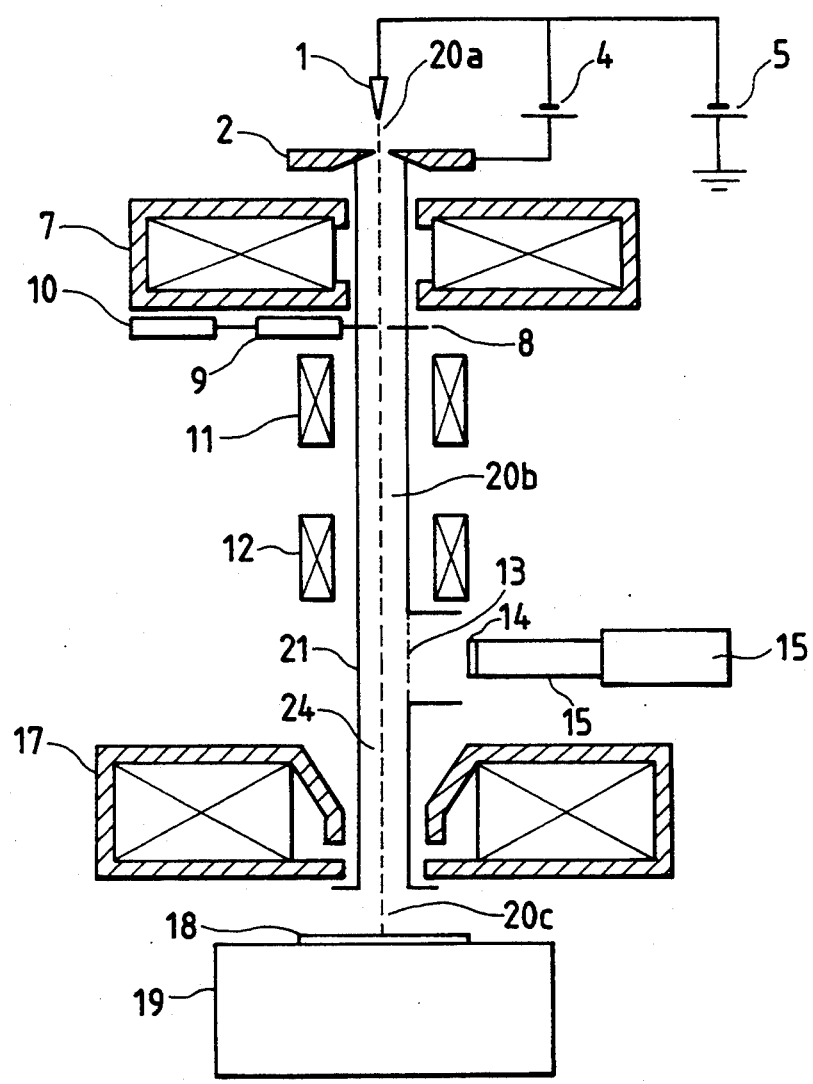
FIG. 7 is a block diagram of the scanning electron microscope which is the seventh embodiment of the present invention.

FIG. 7 is a block diagram of the essential portion of the scanning electron microscope which is a seventh embodiment oft he present invention. The same symbols as those of the sixth embodiment represent the same or equivalent portions.

This embodiment is characterized in that an anode constituting an electron gun is omitted and the drawout electrode 2 is connected with the path cylinder 21. This construction is simplified because the anode and a superimposed voltage source are omitted.

Figure 8:
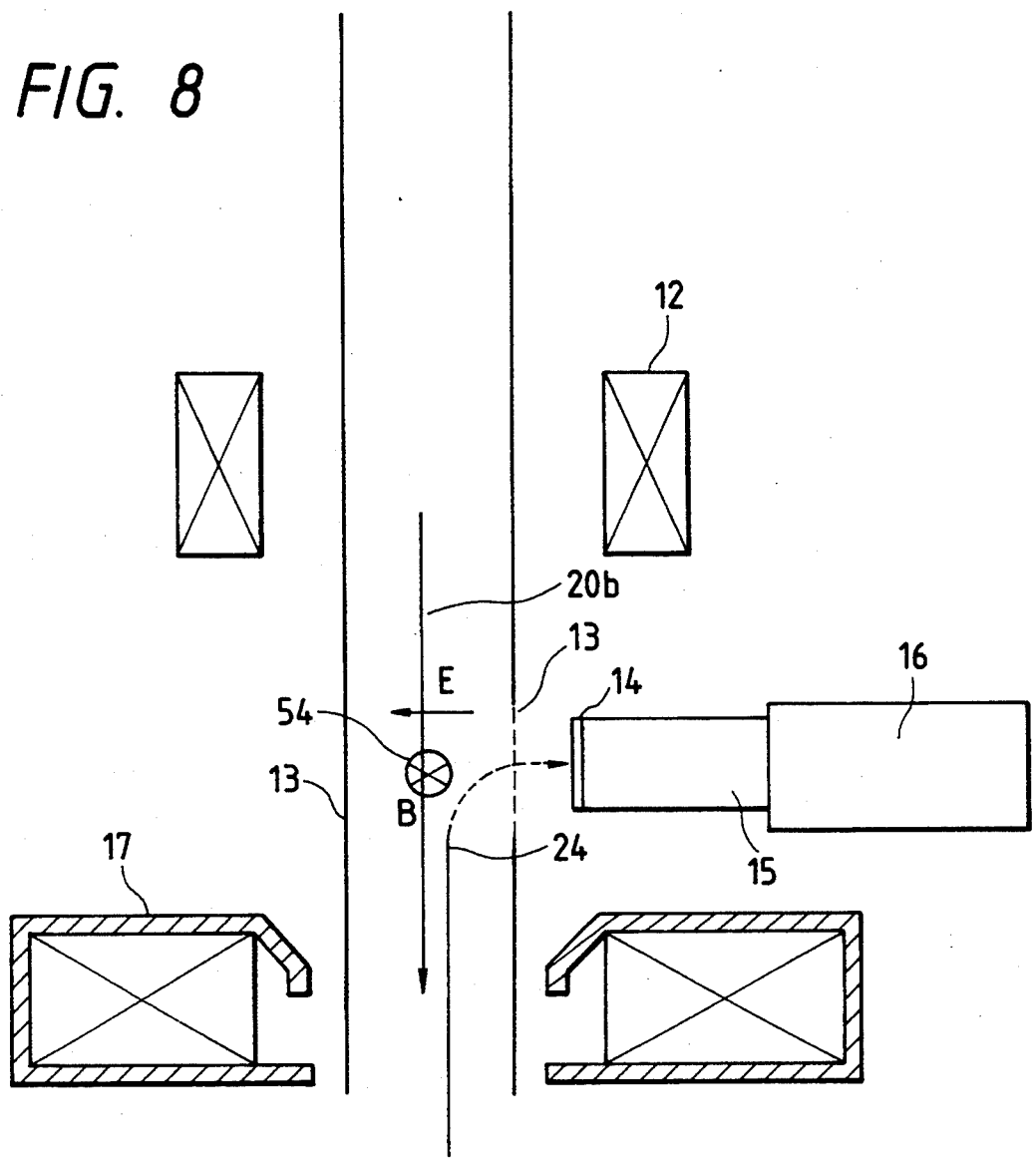
FIG. 8 is a block diagram of the scanning electron microscope which is the eighth embodiment of the present invention.

FIG. 8 is a block diagram of a scanning electron microscope which is an eighth embodiment of the present invention. The same symbols as those of the seventh embodiment represent the same or equivalent portions.

In the first embodiment and the fourth to seventh embodiments, secondary signals are deflected by an electric field and detected by a detector. However, this embodiment is characterized in that secondary signals are deflected by magnetic and electric fields.

When the acceleration voltage increases and the electron-beam deceleration ratio at the final stage decreases because of the deceleration field, the energy difference between the primary electron beam 20b applied to a sample and the secondary electrons 24 emitted from the sample decreases. Therefore, a comparatively, strong electric field E is generated by the attracting electrode 13 in order to attract the secondary electrons 24. However, the primary electron beam 20b is also bent by the electric field E.

This embodiment solves this problem, in which deflection of the primary electron beam 20b due to the electric field E is canceled and the magnetic field B is generated to supplement the deflection of the secondary electrons 24 by accounting for the fact that the direction of deflection an electron beam due to a magnetic field depends on the direction of the electron beam.

That is, this embodiment generates the magnetic field B so that the primary electron beam 22b is deflected in the direction opposite to the direction of deflection caused by the electric field E generated by the attracting electrode 13. Therefore, the deflection of the electron beam 22b due to the electric field E is canceled by properly controlling the intensity of the magnetic field B.

However, because the direction of deflection of secondary electrons due to the magnetic field B is the same as that due to the electric field E, the deflection of the secondary electrons increases and the secondary electrons can easily be detected.

Figure 9:
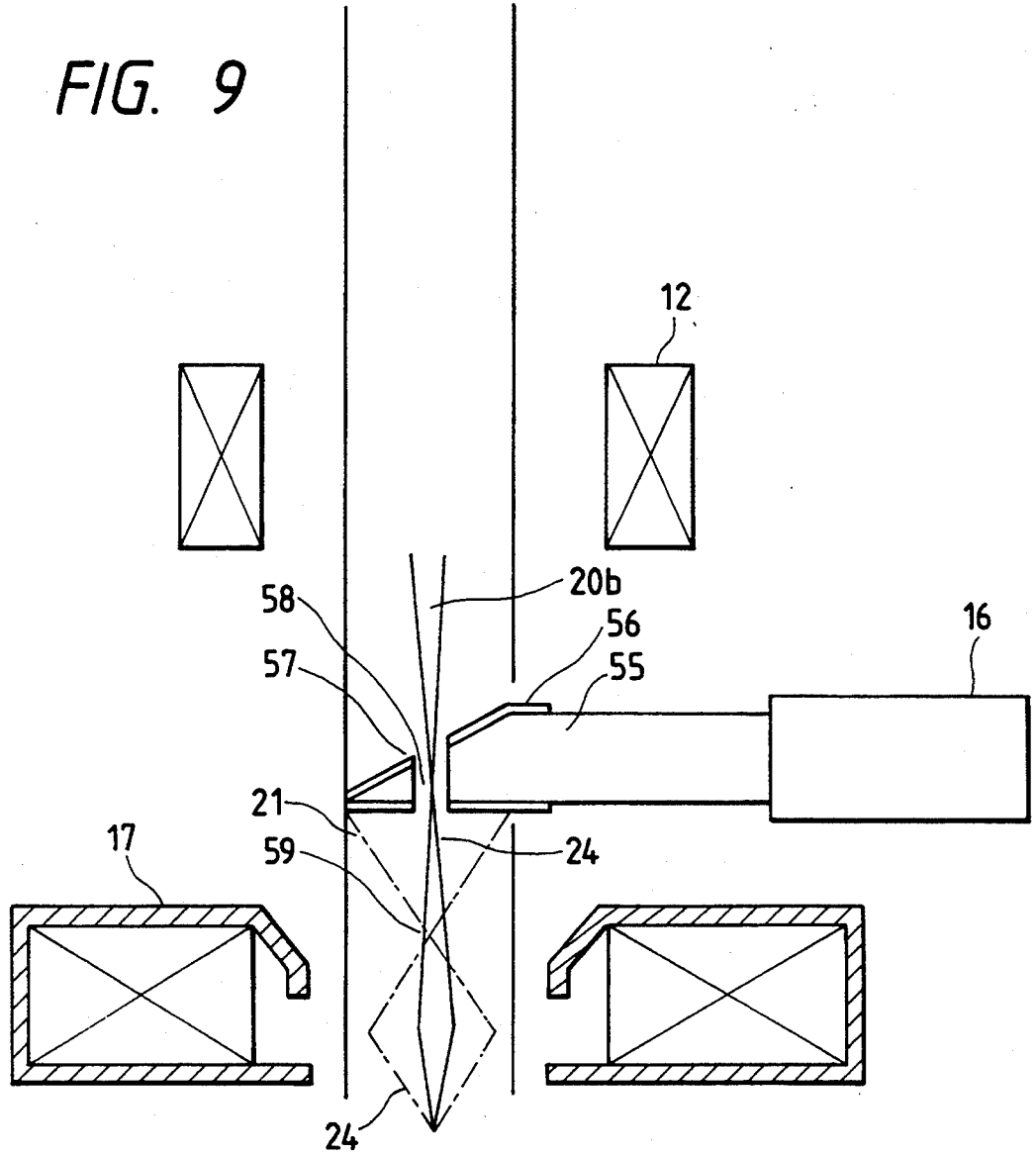
FIG. 9 is a block diagram of the scanning electron microscope which is the ninth embodiment of the present invention.

FIG. 9 is a block diagram of a scanning electron microscope which is a ninth embodiment of the present invention. The same symbols as those of the eighth embodiment represent the same or equivalent portions.

In FIG. 9, a single-crystal scintillator 55 is such that, for example, a cylindrical YAG single crystal is obliquely cut, an opening 57 for passing the primary electrons 20b is formed in the cut surface, the end part of the scintillator 55 is coated with a conductive thin film 56 made of metal or carbon, and the same potential as of the channel 5 cylinder 21 is given to the thin film 56.

In this embodiment, the crossover 58 of the primary electron beam 20b produced by the condenser lens 12 is positioned near the opening 57 and the crossover 59 of the secondary electrons 24 by the objective 17 is positioned apart from the opening 57 and the secondary electrons 24 can efficiently be detected.

The above ninth embodiment comprises a light emitting section and light guide of the scintillator both comprising a YAG single crystal. It is also possible to form only the light emitting section for detecting secondary electrons with a YAG single crystal, and other sections with a transparent member such as glass or resin.

As described above, the embodiments of the present invention make it possible to raise the acceleration voltage of an electron beam when passing through an objective higher than the final acceleration voltage and decrease the blur of a beam due to aberration of the objective.

Moreover, because the electron source is a field-emission-type electron gun in certain embodiments, the energy of a primary electron beam can be decreased and the energy ratio of the energies of primary electron beams before and after deceleration by a deceleration electric field is increased. Therefore, the energy ratio of energy of the primary electron beam to that of the secondary signal increases, secondary signals are easily acquired selectively, and the secondary-signal detection efficiency is improved.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed:

1. A scanning electron microscope for scanning an electron beam on a grounded sample comprising:
   a condenser lens, an objective lens, a sample holder for holding a sample, an electron source for emitting said electron beam in a direction through the condenser lens and objective lens to a sample on the sample holder, a channel cylinder to which is applied positive voltage, said channel cylinder extending continuously from the condenser lens to the objective lens, and a detector for detecting said secondary signal, said detector being located along said channel cylinder intermediate the condenser lens and the sample holder.

2. A scanning electron microscope according to claim 1, wherein said sample is controlled such that the voltage of the sample is lower than the voltage of said channel cylinder.

3. A scanning electron microscope according to claim 2, wherein said electron source is a field-emission-type electron gun.

4. A scanning electron microscope according to claim 1, wherein said electron source is a field-emission-type electron gun.

5. A scanning electron microscope according to claim 1, wherein said detector has an attracting electrode for attracting said electron beam.

6. A scanning electron microscope according to claim 1, comprising a deceleration electric field former that forms a deceleration electric field for the electron beam between the objective lens and the sample.

7. A scanning electron microscope according to claim 6, wherein an opening for drawing attracted secondary signals to the outside of the channel cylinder is formed in the side of the channel cylinder and the secondary signal detector for taking secondary signals out of the opening for detection.

8. A scanning electron microscope according to claim 7, wherein an attracting electrode to which a potential for attracting secondary signals is provided is mounted in said opening.

9. A scanning electron microscope according to claim 6, wherein the secondary signal detector is a channel plate detector provided with an opening serving as an electron channel at a center of the opening.

10. A scanning electron microscope according to claim 9, further comprising means for applying a voltage to the channel plate detector.

11. A scanning electron microscope according to claim 6, wherein the secondary signal detector is a single-crystal scintillator.

12. A scanning electron microscope according to claim 6, further comprising potential barrier generating means for generating a potential barrier to sort secondary signals, the potential barrier generating means being arranged between the sample and the secondary signal detector.

13. A scanning electron microscope according to claim 6, further comprising a control electrode that generates an electric field to decrease the influence of the acceleration electric field generated by the channel cylinder on the sample, said control electrode being between the sample and the objective lens.

14. A scanning electron microscope according to claim 6, wherein the channel cylinder is an insulating cylinder with insulated conductive thin films coated on its inner and outer surfaces.

15. A scanning electron microscope according to claim 6, wherein the scanning electron microscope further comprises means for generating a magnetic field such that deflection of the primary electron beam due to the attracting electric field is canceled and the deflection of the secondary signal generated by the sample is supplemented.

16. A scanning electron microscope according to claim 6, further comprising an opening aperture in the channel cylinder which opening aperture has the same potential as the channel cylinder.

17. A scanning electron microscope according to claim 6, wherein the opening aperture has a different potential than the channel cylinder prior to mounting.

18. A method of scanning an electron beam on a grounded sample, and obtaining an image on the basis of a secondary signal produced from said sample, comprising the steps of:

scanning said electron beam onto said sample by passing said electron beam from an electron source through a condenser lens, an objective lens, and a channel cylinder extending continuously from the condenser lens to the objective lens;

applying positive voltage to the channel cylinder; and detecting said secondary signal at a section of said channel cylinder intermediate the condenser lens and the sample.

19. A method according to claim 18, further comprising controlling the voltage of the sample to be lower than the voltage of the channel cylinder.

20. A method according to claim 18, wherein said electron source is a field-emission-type electron gun.

21. A method according to claim 18, wherein said detector has an attracting electrode for attracting said electron beam.

22. A method according to claim 18, further comprising forming a deceleration electric field for the electron beam between the objective lens and the sample.

* * * * *